US010956349B2

(12) United States Patent
Gonzalez et al.

(10) Patent No.: US 10,956,349 B2
(45) Date of Patent: *Mar. 23, 2021

(54) SUPPORT FOR MULTIPLE WIDTHS OF DRAM IN DOUBLE DATA RATE CONTROLLERS OR DATA BUFFERS

(71) Applicant: Integrated Device Technology, Inc., San Jose, CA (US)

(72) Inventors: Alejandro F. Gonzalez, Johns Creek, GA (US); Craig DeSimone, Dacula, GA (US); Garret Davey, Cumming, GA (US); Yue Yu, Johns Creek, GA (US); Roland Knaack, Suwanee, GA (US); Scott Herrington, Suwanee, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/715,109

(22) Filed: Dec. 16, 2019

(65) Prior Publication Data
US 2020/0117629 A1 Apr. 16, 2020

Related U.S. Application Data

(63) Continuation of application No. 16/059,287, filed on Aug. 9, 2018, now Pat. No. 10,565,144.
(Continued)

(51) Int. Cl.
*G06F 13/40* (2006.01)
*G06F 13/42* (2006.01)
(Continued)

(52) U.S. Cl.
CPC ...... *G06F 13/4018* (2013.01); *G06F 13/1678* (2013.01); *G06F 13/4243* (2013.01);
(Continued)

(58) Field of Classification Search
CPC .................. G06F 13/4018; G06F 13/1678
See application file for complete search history.

(56) References Cited

U.S. PATENT DOCUMENTS 9,792,965 B2   10/2017  Best
10,565,144 B2 *  2/2020  Gonzalez ............. G11C 7/1066
2006/0184726 A1  8/2006  Klint ........................ 711/105

* cited by examiner

*Primary Examiner* — Raymond N Phan
(74) *Attorney, Agent, or Firm* — Christopher P. Maiorana, PC

(57) ABSTRACT

An apparatus includes a control circuit comprising (i) a first differential data strobe input/output circuit having a first set of driver and termination control inputs and (ii) a second differential data strobe input/output circuit having a second set of driver and termination control inputs. The first and the second sets of driver and termination control inputs are independently programmable. The first and the second differential data strobe input/output circuits operate in a first mode when the first differential data strobe input/output circuit is connected to a first memory device having a first data width and the second differential data strobe input/output circuit is connected to a second memory device having the first data width. The first and the second differential data strobe input/output circuits operate in a second mode when the first differential data strobe input/output circuit and the second differential data strobe input/output circuit are connected in parallel to a single memory device having a second data width.

20 Claims, 7 Drawing Sheets

Related U.S. Application Data

(60) Provisional application No. 62/578,210, filed on Oct. 27, 2017.

(51) Int. Cl.
*G06F 13/16* (2006.01)
*G11C 7/22* (2006.01)
*G11C 11/4096* (2006.01)
*G11C 7/10* (2006.01)
*G11C 11/4093* (2006.01)
*G11C 11/4076* (2006.01)
*G11C 5/04* (2006.01)

(52) U.S. Cl.
CPC ............ *G06F 13/4282* (2013.01); *G11C 5/04* (2013.01); *G11C 7/109* (2013.01); *G11C 7/1045* (2013.01); *G11C 7/1057* (2013.01); *G11C 7/1066* (2013.01); *G11C 7/1069* (2013.01); *G11C 7/1084* (2013.01); *G11C 7/1093* (2013.01); *G11C 7/1096* (2013.01); *G11C 7/222* (2013.01); *G11C 11/4076* (2013.01); *G11C 11/4093* (2013.01); *G11C 11/4096* (2013.01); *G11C 2207/105* (2013.01); *G11C 2207/108* (2013.01)

SUPPORT FOR MULTIPLE WIDTHS OF DRAM IN DOUBLE DATA RATE CONTROLLERS OR DATA BUFFERS

This application relates to U.S. Ser. No. 16/059,287, filed Aug. 9, 2018, which relates to U.S. Provisional Application No. 62/578,210, filed Oct. 27, 2017, which is hereby incorporated by reference in its entirety.

FIELD OF THE INVENTION

The invention relates to memory generally and, more particularly, to a method and/or apparatus for implementing support for multiple widths of dynamic random access memories (DRAMs) in double data rate (DDR) controllers and/or data buffers.

BACKGROUND

Random access memory (RAM) provides fast, cost-effective, volatile storage for computing devices. The Joint Electron Device Engineering Council (JEDEC) provides memory standards for storage devices. One such standard currently in use is the DDR4 SDRAM (double data rate fourth generation synchronous dynamic random-access memory) standard, which provides higher module density, lower voltage specifications, and higher data rate transfer speeds than previous standards (i.e., DDR, DDR2, and DDR3). Dynamic random access rams (DRAMs) are available with different data widths. Four bits wide DRAMs and eight bits wide DRAMs are generally identified as x4 DRAM and x8 DRAM, respectively.

Conventional techniques to support both x8 DRAMs and x4 DRAMs in the same memory controller or data buffer typically have the disadvantage of requiring multiplexing logic in the data strobe (DQS) path. When a controller or data buffer circuit is designed with matching DQ-DQS receivers, the delay penalty in the DQS path also applies to the data (DQ) paths, which hurts latency performance of the device.

It would be desirable to implement support for multiple widths of dynamic random access memories (DRAMs) in DDR controllers and/or data buffers without incurring a penalty of additional multiplexing logic.

SUMMARY

The invention concerns an apparatus comprising a control circuit comprising (i) a first differential data strobe input/output circuit having a first set of driver and termination control inputs and (ii) a second differential data strobe input/output circuit having a second set of driver and termination control inputs. The first and the second sets of driver and termination control inputs are independently programmable. The first and the second differential data strobe input/output circuits operate in a first mode when the first differential data strobe input/output circuit is connected to a first memory device having a first data width and the second differential data strobe input/output circuit is connected to a second memory device having the first data width. The first and the second differential data strobe input/output circuits operate in a second mode when the first differential data strobe input/output circuit and the second differential data strobe input/output circuit are connected in parallel to a single memory device having a second data width.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing support for multiple widths of dynamic random access memories (DRAMs) in double data rate (DDR) controllers or data buffers that may (i) be implemented without additional multiplexing logic, (ii) implement two separate data strobe input/output (I/O) circuits with each generating a respective differential data strobe signal (DQS), (iii) allow connecting the two respective differential data strobe signals in parallel, (iv) allow independent configuration of drive strength and termination parameters of the two data strobe I/O circuits, (v) allow mixed use of x4 and x8 DRAMs on a dual inline memory module (DIMM), (vi) be implemented in a memory controller, (vii) be implemented in a data buffer, and/or (viii) be implemented as one or more integrated circuits.

In various embodiments, the invention may provide an apparatus and/or method for supporting both x4 DRAMs and x8 DRAMs in a memory controller and/or a data buffer. In various embodiments, a simple and streamlined approach may be provided for support of and/or emulating support for both x4 and x8 DRAMs. In an example, the method may configure two differential data strobe input/output (I/O) circuits (e.g., comprising data strobe receivers, transmitters, and termination circuits), which are already available for supporting x4 DRAMs, in a parallel connection to support x8 DRAMs. By connecting the two differential data strobe I/Os in parallel, the latency penalty from conventional multiplexing logic usually needed for supporting x8 DRAMs may be eliminated.

In an example, to ensure desired signal levels when the two differential data strobe I/Os are connected in parallel, control registers may be defined for drivers and termination circuits that are independent for each data strobe I/O circuit. These features may be easily implemented and allow the memory controller or data buffer to ensure there is only one data strobe output driving the same net at a given time, and that the resulting termination strengths from the two data strobe I/Os connected in parallel are consistent with that of the DQ receivers.

Figure 1:
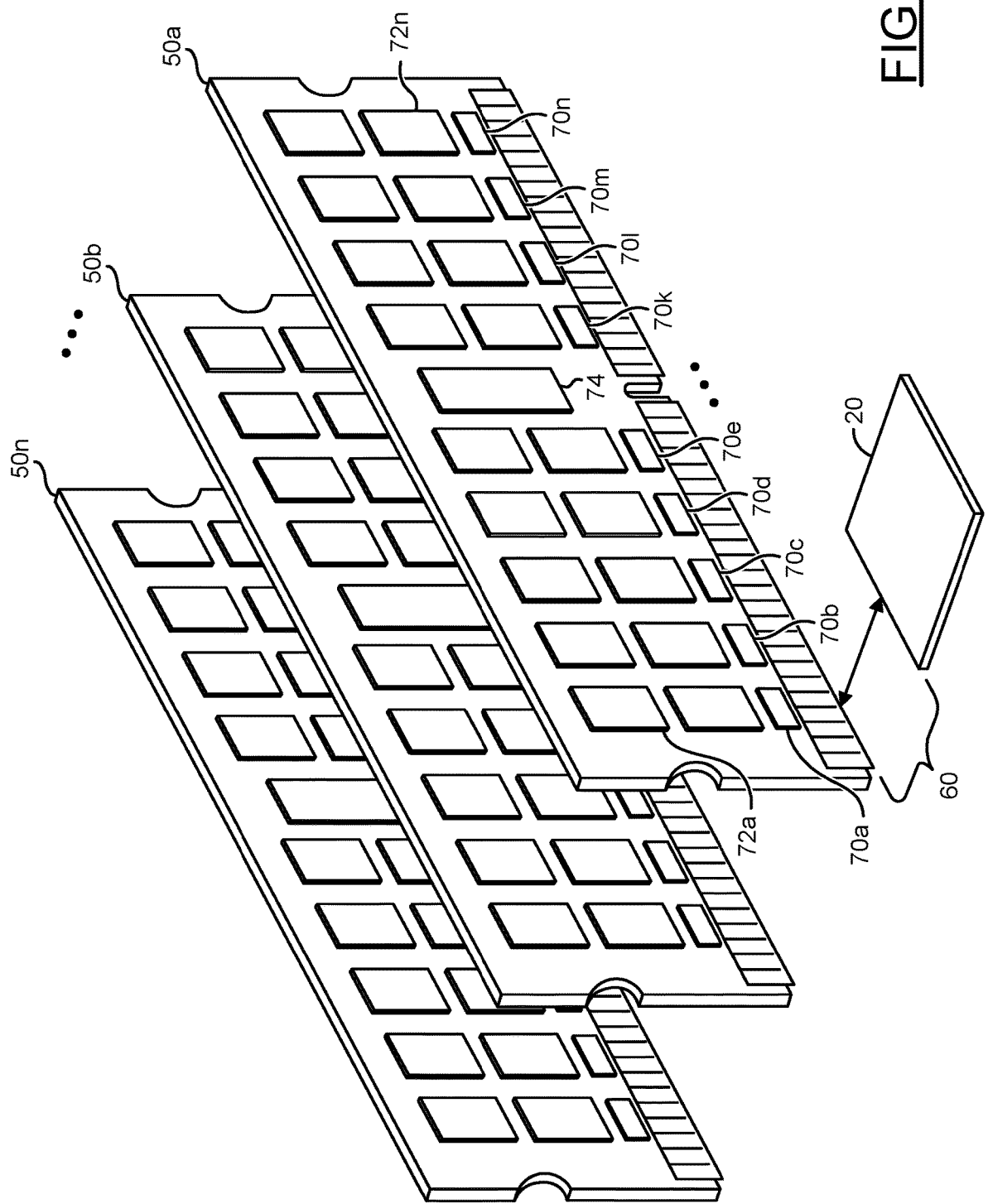
FIG. 1 is a diagram illustrating an example embodiment of a memory system.

Referring to FIG. 1, a diagram of a memory system is shown in accordance with an example embodiment of the invention. In various embodiments, the memory system includes a number of circuits 50a-50n. The circuits 50a-50n may be implemented as memory modules (or boards). In an example, the circuits 50a-50n may be implemented as dual in-line memory modules (DIMMs). In some embodiments, the circuits 50a-50n may be implemented as double data rate fourth generation (DDR4) synchronous dynamic random-access memory (SDRAM) modules. In some embodiments, the circuits 50a-50n may be implemented as double data rate fifth generation (DDR5) SDRAM modules.

In various embodiments, the circuits 50a-50n may comprise a number of blocks (or circuits) 70a-70n, a number of blocks (or circuits) 72a-72n, a block (or circuit) 74 and/or various other blocks, circuits, pins, connectors and/or traces. The circuits 70a-70n may be configured as data buffers. The circuits 72a-72n may implement memory devices. In an example, the circuits 72a-72n may be implemented as synchronous dynamic random-access memory (SDRAM) devices (or chips, or modules). The circuit 74 may be implemented as a registered clock driver (RCD). In an example, the RCD circuit 74 may be implemented as a DDR4 RCD circuit. In another example, the RCD circuit 74 may be implemented as a DDR5 RCD circuit. The type, arrangement and/or number of components of the memory modules 50a-50n may be varied to meet the design criteria of a particular implementation. For example, in embodiments implementing the circuits 50a-50n as DDR5 compliant SDRAM modules, the memory modules 50a-50n may comprise the circuits 72a-72n arranged in rows of ten SDRAM devices (or chips, or modules), the circuits 70a-70n arranged in a row corresponding with the circuits 72a-72n, the RCD circuit 74 located so that the circuits 72a-72n are in groups of five on either of two sides of the RCD circuit 74, and a power management integrated circuit (PMIC) compliant with the JEDEC DDR5 specification.

The memory modules 50a-50n are shown connected to a block (or circuit) 20. The circuit 20 may implement a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard (or main board). In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to the computer motherboard (e.g., by pins, traces and/or connectors 60) to transfer data between components of a computing device and the memory modules 50a-50n. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 50a-50n may be implemented as DDR4 (or DDR5) SDRAM memory modules. In an example implementing DDR4 memory, the circuits 50a-50n may have a memory module density of 128 gigabyte (GB) or higher per module (e.g., compared to 16 GB per dual in-line memory module (DIMM) in DDR3). In embodiments implementing DDR4 compliant SDRAM memory modules, the circuits 50a-50n may operate at voltages of 1.14 to 1.26 volts (V) with a frequency between 800-1600 megahertz (MHZ) (e.g., compared to 1.35-1.575V at frequencies between 400-1067 MHZ in DDR3). In embodiments implementing DDR5 compliant SDRAM memory modules, the circuits 50a-50n may operate with a frequency of 1.2-3.2 giga-Hertz (GHz) and/or higher frequencies. In embodiments implementing DDR4 compliant SDRAM memory modules, the circuits 50a-50n may transfer data at speeds of about 1.6 to 3.2 giga-transfers per second (GT/s) and higher (e.g., compared to 0.8 to 2.13 GT/s in DDR3). The operating parameters of the memory modules 50a-50n may be varied according to the design criteria of a particular implementation.

In an example, the memory modules 50a-50n may be compliant with the DDR4 specification entitled "DDR4 SDRAM", specification JESD79-4B, June 2017, published by the Joint Electron Device Engineering Council (JEDEC) Solid State Technology Association, Arlington, Va. Appropriate sections of the DDR4 specification (e.g., the JEDEC specification) are hereby incorporated by reference in their entirety.

The memory modules 50a-50n may be implemented as DDR4 load reduced DIMM (LRDIMM). The data buffers 70a-70n may allow the memory modules 50a-50n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
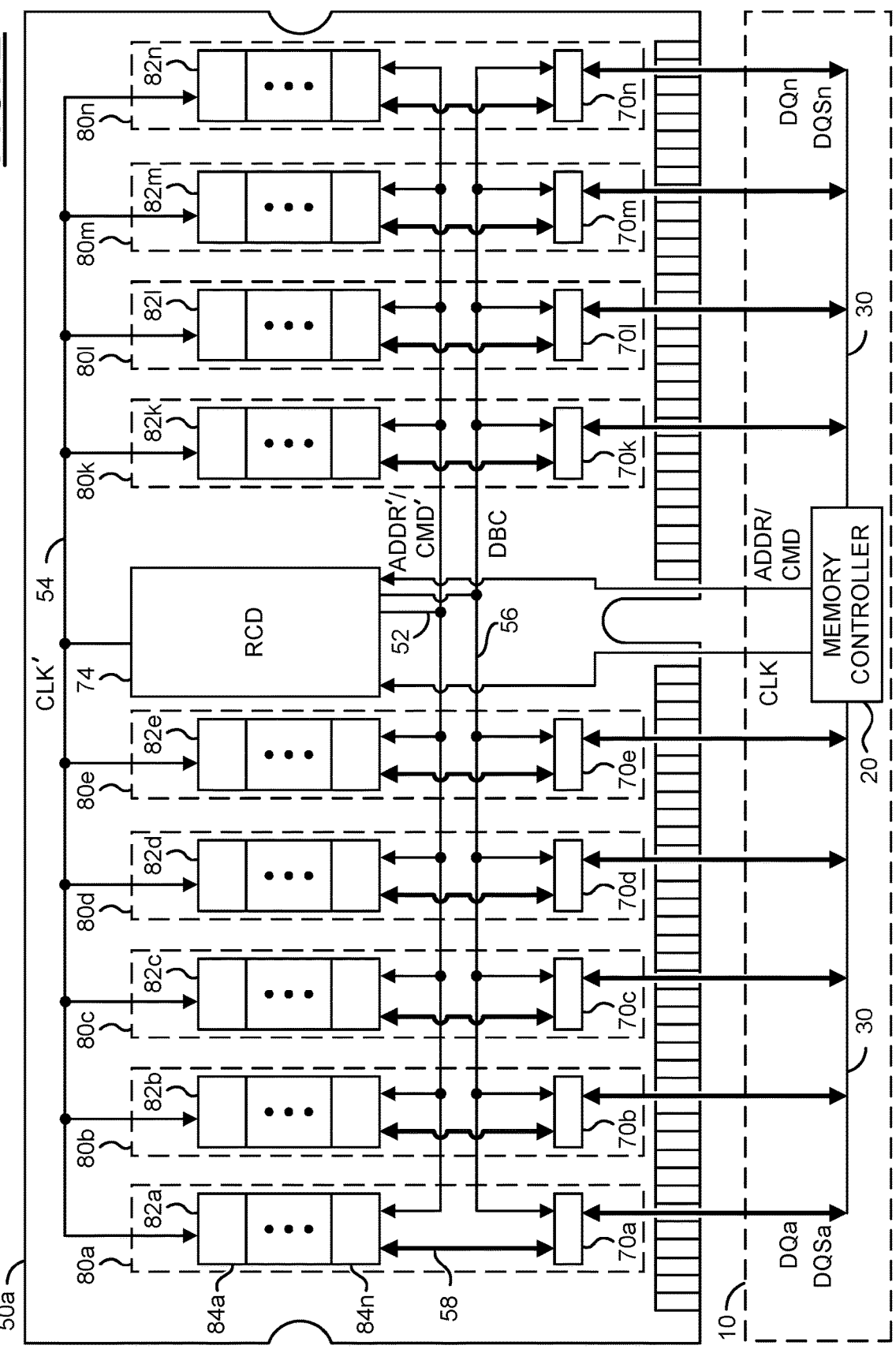
FIG. 2 is a block diagram illustrating a memory module of FIG. 1.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine that communicates with the memory module 50a.

The memory module 50a may comprise one or more blocks (or circuits) 80a-80n and/or the RCD circuit 74. The circuits 80a-80n may implement data paths of the memory module 50a. For example, the data path 80a may include a block 82a and/or the data buffer 70a. The data paths 80b-80n may have similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a clock signal (e.g., CLK) and a number of control signals (e.g., ADDR/CMD). The signal CLK and/or the signals ADDR/CMD may be presented to the RCD circuit 74. A data bus 30 may be connected between the memory controller 20 and the data paths 80a-80n. The memory controller 20 may generate and/or receive data signals (e.g., DQa-DQn) and data strobe signals (e.g. DQSa-DQSn) that may be presented/received from the data bus 30. Portions of the signals DQa-DQn and DQSa-DQSn may be presented to respective data paths 80a-80n.

The RCD circuit 74 may be configured to communicate with the memory controller 20, the memory channels 82a-82n and/or the data buffers 70a-70n. The RCD circuit 74 may decode instructions received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. For example, the RCD circuit 74 may have two sets (e.g., A and B) of command/address outputs. The RCD circuit 74 may support an at-speed bus (e.g., a BCOM bus between the RCD circuit 74 and the data buffers 70a-70n). The RCD circuit 74 may implement automatic impedance calibration. The RCD circuit 74 may implement command/address parity checking. The RCD circuit 74 may control register RCW readback. In an example, the RCD circuit 74 may implement a serial communication bus (e.g., a 1 MHz inter-integrated circuit ($I^2C$) bus, etc.). However, other types of management bus protocols (e.g., sideband interface, etc.) may be implemented to meet design criteria of particular implementations. Inputs to the RCD circuit 74 may be pseudo-differential using external and/or internal reference voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs). The RCD circuit 74 may also be configured to generate a signal (e.g., CLK') and signals (e.g., ADDR'/CMD'). For example, the signal CLK' may correspond with a signal Y_CLK in the DDR4 specification. The signal CLK' and/or the signals ADDR'/CMD' may be presented to each of the memory channels 82a-82n. In an example, the signals ADDR'/CMD' and CLK' may be transmitted on a common bus 52 and a common bus 54, respectively. In another example, the RCD circuit 74 may implement a single ADDR/CMD input and two ADDR'/CMD' outputs to support a 1:2 command/address architecture. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles for x4 DRAMS or 8-bit bytes for x8 DRAMs). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble, or a byte. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 70a-70n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 70a-70n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 70a-70n. The memory modules 50a-50n may implement 2 millimeter (mm) frontside bus traces and backside traces (e.g., the connectors/pins/traces 60). A propagation delay through the data buffers 70a-70n may be 33% faster than through a DDR3 memory buffer (e.g., resulting in reduced latency). In some embodiments, the data buffers 70a-70n may be smaller (e.g., a reduced area parameter) than a data buffer used for DDR3 applications.

Figure 3:
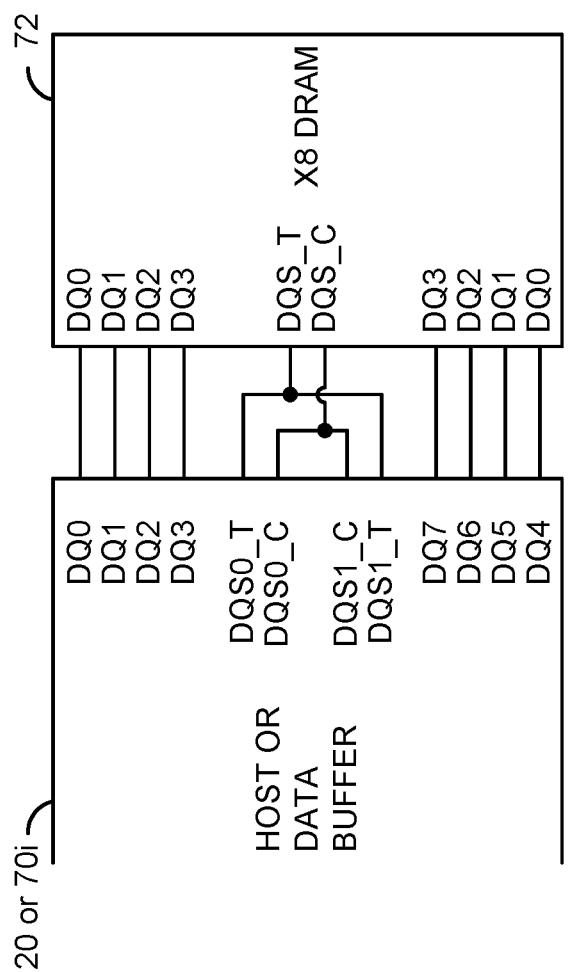
FIG. 3 is a diagram illustrating an example embodiment of the invention.

Referring to FIG. 3, a diagram is shown illustrating data strobe (DQS) input/outputs (I/Os) connected in accordance with an example embodiment of the invention. In an example embodiment, traces connecting the controller 20 or the data buffers 70a-70n (e.g., represented by data buffer 70i) to the DRAMs 72 may be configured to connect the two differential data strobe signals (e.g., DQS0(t,c) and DQS1 (t,c)) in parallel prior to presentation to the DRAMs 72. In an example, the method and/or apparatus in accordance with an example embodiment of the invention may configure two differential data strobe I/Os (e.g., receiver, transmitter, and on-die termination circuits) associated with the differential data strobe signals DQS0(t,c) and DQS1(t,c) to operate in a parallel connection to support x8 DRAMs. By connecting the two differential data strobe I/Os in parallel, the latency penalty from conventional multiplexing logic usually needed for supporting x8 DRAMs may be eliminated.

In various embodiments, independent control registers may be defined for each of the driver (DRV) circuits, the receiver (RCV) circuits, and the on-die termination (ODT) circuits in each data strobe I/O circuit. The independent control registers generally enable designers to ensure desired signal levels when the two differential data strobe I/Os are connected in parallel. These features may be easily implemented and allow the memory controller 20 or data buffers 70a-70n to ensure there is only one data strobe output driving the same net at a given time, and that the resulting termination strengths from the two data strobe I/Os connected in parallel are consistent with that of the DQ receivers.

Figure 4:
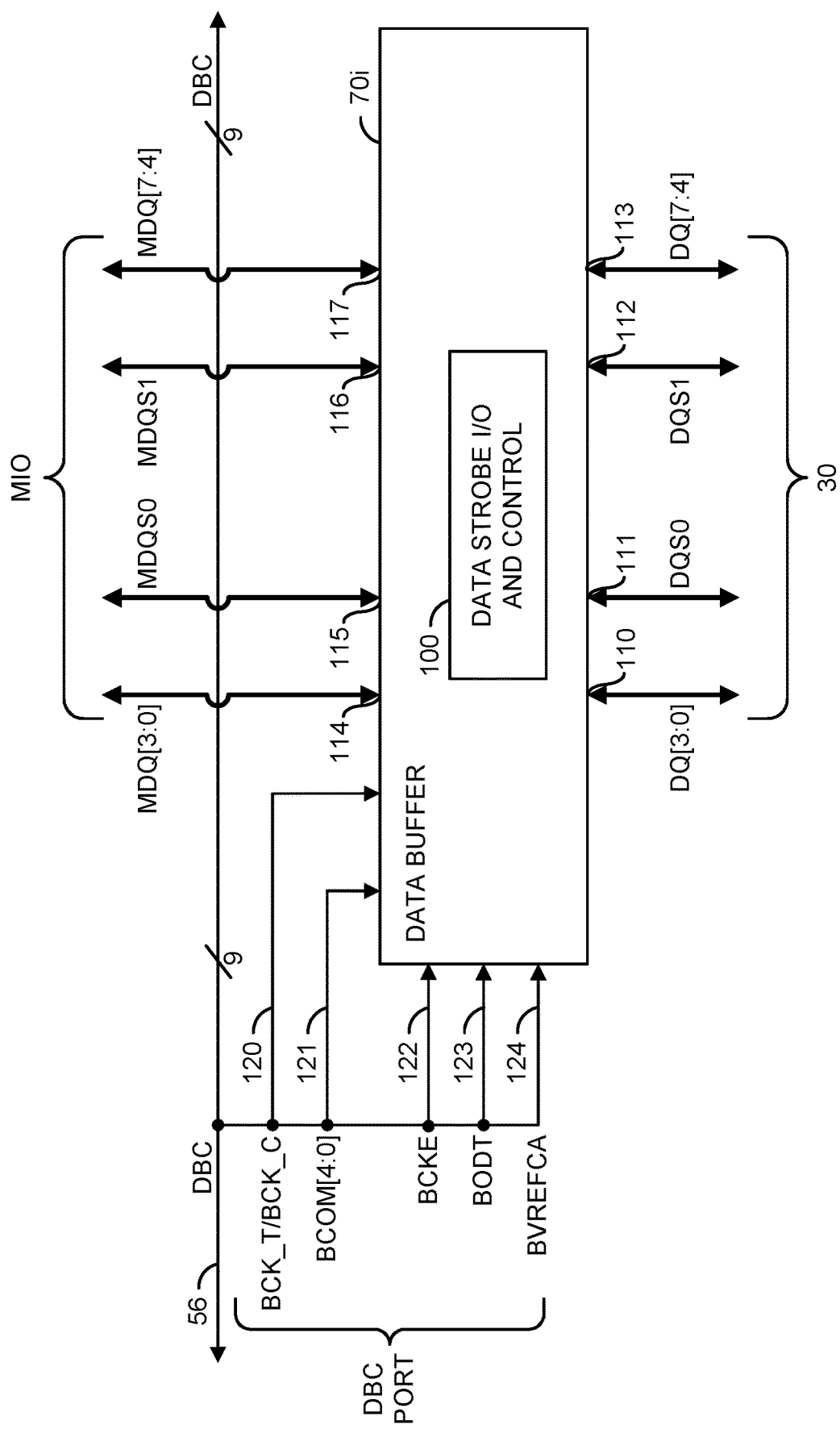
FIG. 4 is a diagram illustrating another example embodiment of the invention.

Referring to FIG. 4, a diagram is shown illustrating a data buffer 70i in accordance with an example embodiment of the invention. The data buffer 70i may be representative of an example embodiment of the data buffers 70a-70n. The data buffer 70i may comprise a data strobe I/O and control block (or circuit) 100. In an example, the data strobe I/O and control block 100 may be configured to ensure correct signal levels when the two differential data strobe I/Os (e.g., MDQS0 and MDQS1) are connected in parallel to support x8 DRAM. In an example, the data strobe I/O and control block 100 may comprise control registers that are implemented independently for each data strobe I/O of the data buffer 70i. The independent control registers may be configured to define parameters for respective driver circuits, receiver circuits, and termination circuits corresponding to each data strobe I/O. The control registers may allow the data buffer 70i to ensure there is only one data strobe output driving a given net at a given time, and ensure that the resulting termination strengths from the two data strobe I/Os, when connected in parallel, are consistent with that of the DQ receivers. The data buffer 70i is shown having a first input/output 110, a second input/output 111, a third input/output 112, a fourth input/output 113, a fifth input/output 114, a sixth input/output 115, a seventh input/output 116, and an eighth input/output 117.

The first input/output 110 may be configured for presenting/receiving data signal(s) DQ[3:0] (e.g., the lower nibble of the data signal(s) DQi corresponding to a memory channel) between the data buffer 70i and the controller 20. The second input/output 111 may be configured for presenting/receiving the signal(s) DQS0 (e.g., the data strobe signal(s) DQS0i corresponding to the memory channel) between the data buffer 70i and the controller 20. The third input/output 112 may be configured for presenting/receiving the signal(s) DQS1 (e.g., the data strobes signal(s) DQS1i corresponding to the memory channel) between the data buffer 70i and the controller 20. The fourth input/output 113 may be configured for presenting/receiving data signal(s) DQ[7:4] (e.g., the upper nibble of the data signal(s) DQi corresponding to the memory channel) between the data buffer 70i and the controller 20. In an example, the first input/output 110, the second input/output 111, the third input/output 112, and the fourth input/output 113 may be implemented as differential (or pseudo-differential) input/outputs.

The fifth input/output 114 may be configured for presenting/receiving the signals MDQ0-MDQ3 as memory input/output (MIO) signals corresponding to the lower nibble of the memory channel between the data buffer 70i and the respective memory devices (e.g., DRAM chips) 72. The sixth input/output 115 may be configured for presenting/receiving the differential (e.g., true and complement) signals MDQS0 as memory input/output (MIO) signals corresponding to the data strobe signal(s) corresponding to data signals MDQ0-MDQ3 between the data buffer 70i and the respective memory devices (e.g., DRAM chips) 72. The seventh input/output 116 may be configured for presenting/receiving the differential (e.g., true and complement) signals MDQS1 as memory input/output (MIO) signals corresponding to the data strobe signal(s) corresponding to data signals MDQ4-MDQ7 between the data buffer 70i and the respective memory devices (e.g., DRAM chips) 72. The eighth input/output 117 may be configured for presenting/receiving the signals MDQ4-MDQ7 as memory input/output (MIO) signals corresponding to the upper nibble of the memory channel between the data buffer 70i and the respective memory devices (e.g., DRAM chips) 72.

The MIO signals are generally transmitted between the memory modules 72 and the respective duplex data buffer 70a-70n. In an example, data (e.g., the signals DQi) from each channel of the memory controller 20 may be presented to the data buffer 70i, buffered in the data buffer 70i, then transmitted to the respective memory device(s) 72 (e.g., the signals MDQi). In another example, data (e.g., the signals MDQi) from the respective memory device(s) 72 may be presented to the data buffer 70i, buffered in the data buffer 70i, and then transmitted on an appropriate memory channel (e.g., the signals DQi) to the memory controller 20.

The data buffer 70i is shown also receiving signals (e.g., DBC) from the bus 56 at a control port (e.g., DBC PORT). The signals DBC may be presented to each of the data buffers 70a-70n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 70i is shown having an input 120 receiving the signals BCK_T/BCK_C, an input 121 receiving the signal(s) BCOM, an input 122 receiving the signal BCKE, an input 123 receiving the signal BODT, and an input 124 receiving the signal BVREFCA.

In various embodiments, the signals BCK_T/BCK_C may be implemented as a 2-bit signal representing a differential (e.g., true (T) and complementary (C) versions) clock signal for the data buffers 70a-70n. In various embodiments, the signal BCOM may be implemented as a 4-bit signal representing data buffer commands. The signal BCOM may be implemented as a unidirectional signal from the RCD circuit 74 to the duplex data buffers 70a-70n. In an example, the signal BCOM may be implemented at a single data rate (e.g., 1 bit per signal per clock cycle). However, a particular command may take a different number of clock cycles to transfer information. The signal BCKE may implement a buffered clock enable signal. In an example, the signal BCKE may be a function registered dedicated non-encoded signal (DCKE). The signal BODT may implement a buffered on-die termination signal. In an example, the signal BODT may be a function registered dedicated non-encoded signal (DODT). The signal BVREFCA may be a reference voltage for use with pseudo-differential command and control signals.

The data buffers 70a-70n may receive a set of data buffer commands (e.g., for writing buffer control words (BCWs)) from the signals DBC. The buffer control words may be used to customize operation of the respective channel of the data buffers 70a-70n. The buffer control words may flow from the memory controller 20, through the RCD circuit 74, to the data buffers 70a-70n. The buffer control words may be similar to register control words (RCWS) used for configuring the RCD circuit 74. Similar to commands for writing the register control words, the commands for writing the buffer control words may look like an MRS7 command, where the address lines are really the payload.

In embodiments where the bus 56 comprises nine pins, the RCD circuit 74 may do more than pass a buffer control word directly through to the data buffers 70a-70n. In one example, the RCD circuit 74 may convert (e.g., multiplex) an MRS7 command format into a buffer control word in a BCOM format. The RCD circuit 74 may map the 12 address bits of the MRS7 command into five separate data transfers, each 4 bits wide. The five data transfers may be set up back to back over one of the bus 56. For example, 5 clock cycles plus a parity cycle may be used to complete the buffer command in the buffer control word. Once the buffer control word reaches the data buffers 70a-70n, the data buffers 70a-70n may decode the buffer control word, write the buffer control word to a function space of the duplex data buffer, and complete the buffer command in the buffer control word.

A function of the signal BCOM may be to transmit the buffer control words. However, compliant with the JEDEC specification for DDR4 SDRAM, the duplex RCD circuit 74 may send all read/write commands and some MRS information over the bus 56 (e.g., to allow the data buffers 70a-70n to keep track of what the memory devices 72 are doing). In some embodiments, different buffer commands may take a different number of cycles to transfer the information.

In implementations for DDR4, the RCD circuit 74 may receive an MRS7 command from the memory controller 20 (e.g., from a host). For example, a host may want to change a parameter (e.g., typically on boot up of a computing device). The RCD circuit 74 may check the MRS7 command to determine whether the address bit 12 is set to 1 (e.g., a logical one). In an example, when an address bit 12 of the MRS7 command is set to 1, the RCD circuit 74 may recognize the command as a buffer command (e.g., a command that is not meant for the RCD circuit 74). The RCD circuit 74 may convert the command from the memory controller 20 to a buffer control word and send the buffer control word to the data buffers 70a-70n via the bus 56. The data buffers 70a-70n may write the buffer control word to a function space to complete the command.

In implementations compliant with DDR5, the RCD circuit 74 may receive a mode register write (MRW) command from the memory controller 20. The RCD circuit 74 forwards MRW commands to the memory devices 72a-72n and to the data buffers 70a-70n as long as the respective output interfaces are enabled to forward commands. The MRW commands generally contain a control word (CW) bit. The CW bit generally indicates if the command is intended for the memory devices 72a-72n or for the logic devices (e.g., the RCD circuit 74 or the data buffers 70a-70n). In MRW commands targeting the logic devices, the most significant bit of an 8-bit control word address may be used, for example, to identify if the target device is the RCD circuit 74 or the data buffers 70a-70n. In general, all devices in the memory modules 50a-50n have an opportunity to snoop configuration information intended for the other devices in the same module.

The data buffers 70a-70n may be configurable. The buffer commands may allow the memory controller 20 to customize aspects of termination (e.g., ODT) and signal strength (e.g., DRV) on the DQ and DQS lines, and/or events (e.g., receiver timing, driver timing, etc.) in both directions (e.g., for both read and write operations). In some embodiments, some of the configurations of the data buffers 70a-70n may be decided based on system level configurations. Generally, most of the configuration of the data buffers 70a-70n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 70a-70n. The bus 56 may also be utilized to send commands (e.g., data reads and/or data writes) that control data traffic through the data buffers 70a-70n. For example, some commands may optimize power consumption of the data buffers 70a-70n. In another example, read/write delays may be added per data line.

The data buffers 70a-70n may implement dual multi-bit (e.g., 4-bit) bidirectional data registers with respective controller side data strobes (e.g., DQS0 and DQS1) and memory side data strobes (e.g., MDQS0 and MDQS1). In various embodiments, the data buffers 70a-70n may implement dual multi-bit (e.g., 4-bit) bidirectional data registers with respective differential controller side data strobes (e.g., DQS0_T/DQS0_C and DQS1_T/DQS1_C) and respective differential memory side data strobes (e.g., MDQS0_T/MDQS0_C and MDQS1_T/MDQS1_C). The two differential memory side data strobe I/Os MDQS0_T/MDQS0_C and MDQS1_T/MDQS1_C may be connected in parallel. The data buffers 70a-70n generally include control registers for driver and termination configuration that are independent for each data strobe I/O MDQS0_T/MDQS0_C or MDQS1_T/MDQS1_C. The independent control registers generally allow a user, for example, to ensure there is only one data strobe output driving the same net at a given time, and to ensure that the resulting termination strengths from the two I/Os connected in parallel are consistent with that of the DQ receivers. The data buffers 70a-70n may implement automatic impedance calibration. The data buffers 70a-70n may implement BCOM parity checking. The data buffers 70a-70n may implement control register (e.g., buffer control word) readback.

Figure 5:
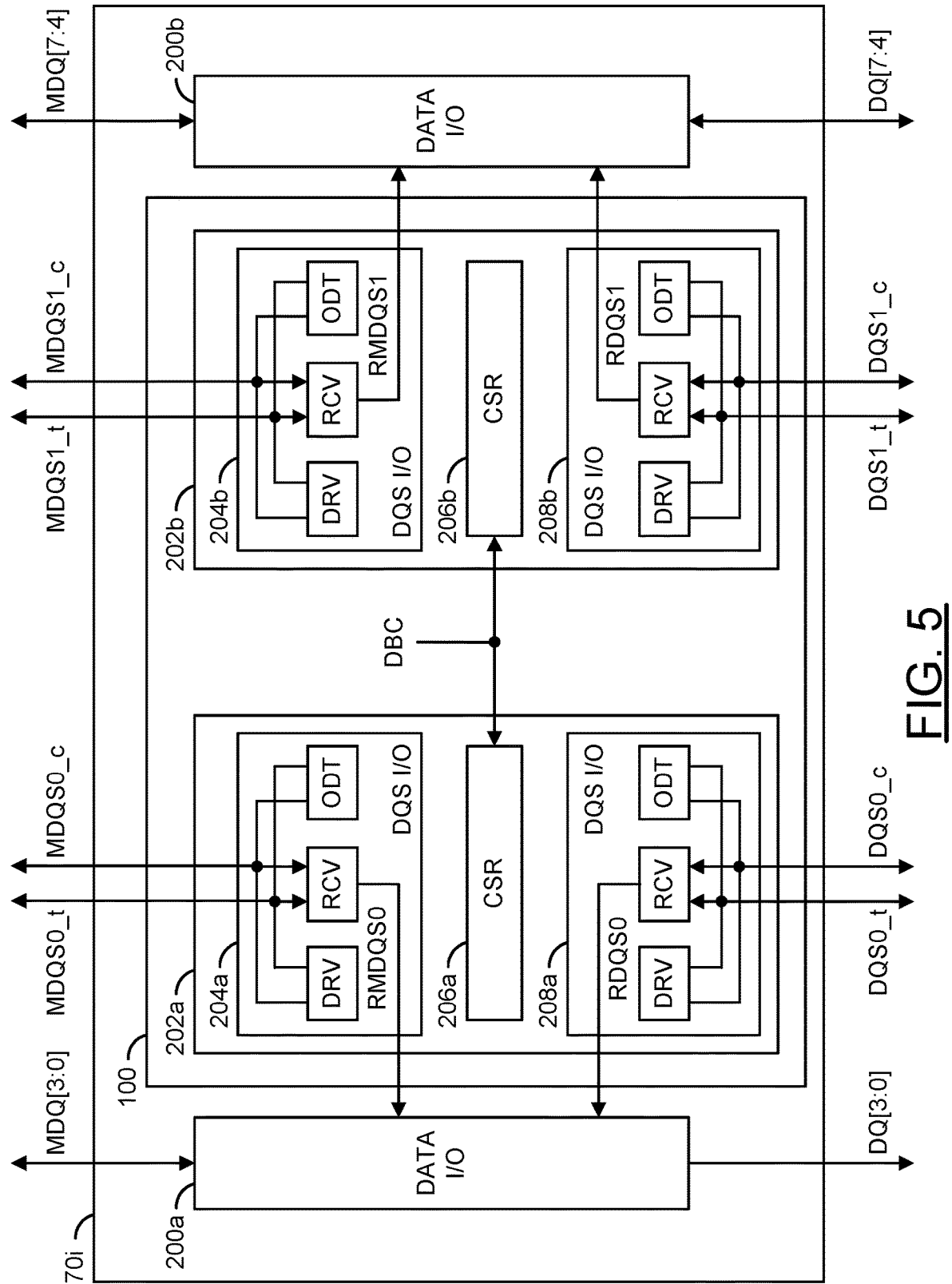
FIG. 5 is a diagram illustrating an example implementation of a data strobe input/output control circuit in accordance with an example embodiment of the invention.

Referring to FIG. 5, a diagram of the circuit 70i is shown illustrating an example implementation of a data strobe input/output control circuit 100 in accordance with an example embodiment of the invention. In an example, the circuit 70i may comprise the data strobe input/output control circuit 100, a first data input/output (I/O) block (or circuit) 200a, and a second data input/output (I/O) block (or circuit) 200b. The data input/output block 200a may be configured to present/receive the signal(s) DQ[3:0] to/from the controller 20 and to present/receive the signal(s) MDQ[3:0] to/from one or more of the memory devices 72a-72n. The data input/output block 200b may be configured to present/ receive the signal(s) DQ[7:4] to/from the controller 20 and to present/receive the signal(s) MDQ[7:4] to/from one or more of the memory devices 72a-72n.

The data strobe input/output (I/O) control circuit 100 may comprise a first data strobe input/output (I/O) block (or circuit) 202a and a second data strobe input/output (I/O) block (or circuit) 202b. The data strobe input/output block 202a may be configured to present/receive the data strobe signal(s) DQS0_t and DQS0_c to/from the controller 20. The data strobe input/output block 202a may be configured to present/receive the data strobe signal(s) MDQS0_t and MDQS0_c to/from the one or more of the memory devices 72a-72n. The data strobe input/output block 202a may be configured to present a received memory-side data strobe signal (e.g., RMDQS0) and a received controller-side data strobe signal (e.g., RDQS0) to the first data I/O block 200a. The signals RMDQS0 and RDQS0 may be used by the first data I/O block 200a to receive data via the signals MDQ[3:0] and DQ[3:0], respectively.

The data strobe input/output block 202b may be configured to present/receive the data strobe signal(s) DQS1_t and DQS1_c to/from the controller 20. The data strobe input/output block 202b may be configured to present/receive the data strobe signal(s) MDQS1_t and MDQS1_c to/from the one or more of the memory devices 72a-72n. The data strobe input/output block 202b may be configured to present a received memory-side data strobe signal (e.g., RMDQS1) and a received controller-side data strobe signal (e.g., RDQS1) to the second data I/O block 200b. The signals RMDQS1 and RDQS1 may be used by the second data I/O block 200b to receive data via the signals MDQ[7:4] and DQ[7:4], respectively.

The data strobe input/output block 202a may comprise a block (or circuit) 204a, a block (or circuit) 206a, and a block (or circuit) 208a. The circuit 204a may implement a first data strobe I/O circuit. The circuit 206a may implement one or more control registers. The circuit 208a may implement a second data strobe I/O circuit. The control registers 206a may be used to configure the circuits 204a and 208a. Each of the circuits 204a and 208a generally comprise a driver block (or circuit) DRV, a receiver block (or circuit) RCV, and an on-die termination block (or circuit) ODT. The driver block DRV, the receiver block RCV, and the on-die termination block ODT may be implemented using either conventional and/or proprietary techniques.

The driver block DRV of the circuit 204a is generally configured to drive the respective data strobe I/Os MDQS0_t and MDQS0_c in response to one or more respective predetermined driver parameters stored in the block 206a. The driver block DRV of the circuit 208a is generally configured to drive the respective data strobe I/Os DQS0_t and DQS0_c in response to one or more respective predetermined driver parameters stored in the block 206a. The on-die termination block ODT of the circuit 204a is generally configured to set a termination impedance of the respective data strobe I/Os MDQS0_t and MDQS0_c in response to one or more respective predetermined termination parameters stored in the block 206a. The on-die termination block ODT of the circuit 208a is generally configured to set a termination impedance of the respective data strobe I/Os DQS0_t and DQS0_c in response to one or more respective predetermined termination parameters stored in the block 206a.

The receiver block RCV of the circuit 204a is generally configured to generate the received memory-side data strobe signal RMDQS0 in response to the respective data strobe I/Os MDQS0_t and MDQS0_c and one or more respective predetermined receiver parameters stored in the block 206a. The receiver block RCV of the circuit 208a is generally configured to generate the received controller-side data strobe signal RDQS0 in response to the respective data strobe I/Os DQS0_t and DQS0_c and one or more respective predetermined receiver parameters stored in the block 206a. The circuits 204a and 208a may be configured to control the respective driver and/or termination parameters of the data strobe I/O circuit 202a based upon values stored in one or more control registers within the circuit 206a. In an example, the various blocks of the circuit 202a may be configured via the registers within the circuit 206a using the data buffer control (DBC) bus 56.

The data strobe input/output block 202b may comprise a block (or circuit) 204b, a block (or circuit) 206b, and a block (or circuit) 208b. The circuit 204b may implement a first data strobe I/O circuit. The circuit 206b may implement one or more control registers. The circuit 208b may implement a second data strobe I/O circuit. The control registers 206b may be used to configure the circuits 204b and 208b. Each of the circuits 204b and 208b generally comprise a driver block (or circuit) DRV, a receiver block (or circuit) RCV, and an on-die termination block (or circuit) ODT. The driver block DRV, the receiver block RCV, and the on-die termination block ODT may be implemented using either conventional and/or proprietary techniques.

The driver block DRV of the circuit 204b is generally configured to drive the respective data strobe I/Os MDQS1_t and MDQS1_c in response to one or more respective predetermined driver parameters stored in the block 206b. The driver block DRV of the circuit 208b is generally configured to drive the respective data strobe I/Os DQS1_t and DQS1_c in response to one or more respective predetermined driver parameters stored in the block 206b. The on-die termination block ODT of the circuit 204b is generally configured to set a termination impedance of the respective data strobe I/Os MDQS1_t and MDQS1_c in response to one or more respective predetermined termination parameters stored in the block 206b. The on-die termination block ODT of the circuit 208b is generally configured to set a termination impedance of the respective data strobe I/Os DQS1_t and DQS1_c in response to one or more respective predetermined termination parameters stored in the block 206b.

The receiver block RCV of the circuit 204b is generally configured to generate the received memory-side data strobe signal RMDQS1 in response to the respective data strobe I/Os MDQS1_t and MDQS1_c and one or more respective predetermined receiver parameters stored in the block 206b. The receiver block RCV of the circuit 208b is generally configured to generate the received controller-side data strobe signal RDQS1 in response to the respective data strobe I/Os DQS1_t and DQS1_c and one or more respective predetermined receiver parameters stored in the block 206b. The circuits 204b and 208b may be configured to control the respective driver and/or termination parameters of the data strobe I/O circuit 202b based upon values stored in one or more control registers within the circuit 206b. In an example, the various blocks of the circuit 202b may be configured via the registers within the circuit 206b using the data buffer control (DBC) bus 56.

In an example, the method and/or apparatus in accordance with an example embodiment of the invention may configure portions (e.g., receiver, transmitter, and on-die termination circuits) of the two differential data strobe I/Os 202a and 202b associated with the differential data strobe signals DQS0(t,c) and DQS1(t,c) to operate in a parallel connection to support x8 DRAMs. By connecting the two differential data strobe I/Os 202a and 202b in parallel, the latency penalty from conventional multiplexing logic usually needed for supporting x8 DRAMs may be eliminated.

In various embodiments, independent control registers may be defined in the blocks 206a and 206b for each of the driver (DRV) circuits, the receiver (RCV) circuits, and the on-die termination (ODT) circuits in each data strobe I/O circuits 204a and 208a, and 204b and 208b, respectively. The independent control registers generally enable designers to ensure desired signal levels when the two differential data strobe I/Os are connected in parallel. These features may be easily implemented and allow the memory controller 20 or data buffers 70a-70n to ensure there is only one data strobe output driving the same net at a given time, and that the resulting termination strengths from the two data strobe I/Os connected in parallel are consistent with that of the DQ receivers.

In various embodiments, the data input/output (I/O) blocks 200a and 200b may be implemented similarly to the differential data strobe I/Os 202a and 202b. For example, the data input/output (I/O) blocks 200a and 200b may comprise driver (DRV) circuits, receiver (RCV) circuits, and termination (ODT) circuits similar to those described above in connection with the differential data strobe I/O blocks 204a, 204b, 208a, and 208b. The driver (DRV) circuits, receiver (RCV) circuits, and termination (ODT) circuits of the data input/output (I/O) blocks 200a and 200b may be configured for presenting/receiving the signals DQ[7:0] to/from the controller 20 and presenting/receiving the signals MDQ[7:4] to/from one or more of the memory devices 72a-72n. In various embodiments, the driver (DRV) circuits, receiver (RCV) circuits, and termination (ODT) circuits of the data input/output (I/O) blocks 200a and 200b may be configured using respective configuration (or control) registers similar to the control registers 206a and 206b described above in connection with the differential data strobe I/O blocks 204a, 204b, 208a, and 208b.

Figure 6:
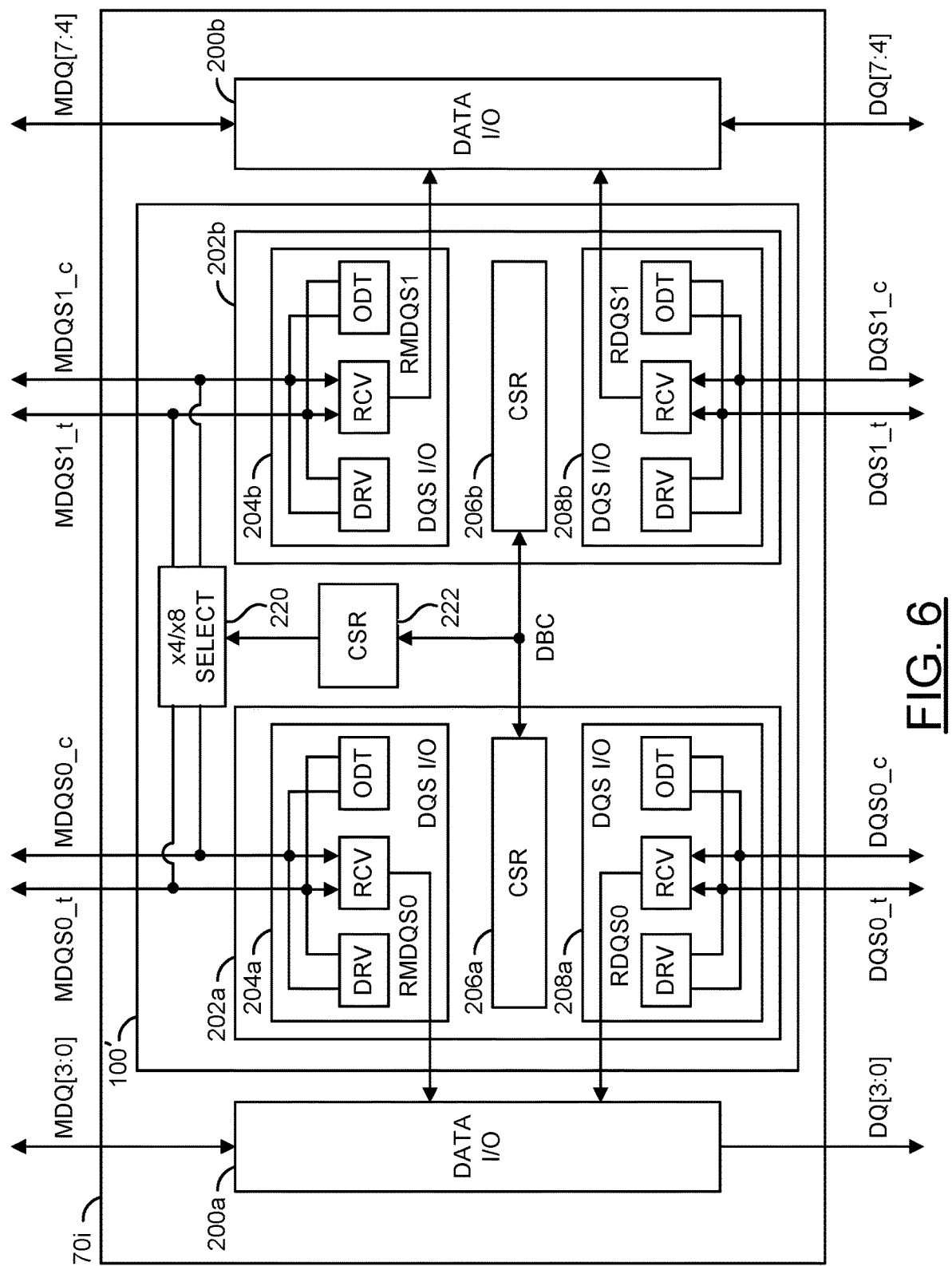
FIG. 6 is a diagram illustrating an example implementation of a data strobe input/output control circuit in accordance with another example embodiment of the invention.

Referring to FIG. 6, a diagram of the circuit 70i is shown illustrating another example implementation of a data strobe input/output control circuit 100' in accordance with another example embodiment of the invention. In another example, the circuit 100' may be implemented similarly to the circuit 100 (described above in connection with FIG. 5), except that the circuit 100' may further comprise a block (or circuit) 220 and a block (or circuit) 222. The block 220 may implement a coupling circuit. The block 220 may implement a control register 222. The control register 222 is generally associated with the coupling circuit 220.

The coupling circuit 220 may be configured to couple the two differential memory side data strobe signals MDQS0(t, c) and MDQS1(t,c) in parallel internally of the circuit 70i rather than through the use of external traces. In applications where the circuit 70i is connected to x4 DRAM, the circuit 222 may be programmed appropriately to configure the coupling block 220 to isolate the memory side data strobe signals MDQS0(t,c) and MDQS1(t,c) from each other. In applications where the circuit 70i is connected to x8 DRAM, the circuit 222 may be programmed appropriately to configure the coupling block 220 to connect the memory side data strobe signals MDQS0(t,c) and MDQS1(t,c) in parallel (e.g., MDQS0_t to MDQS1_t and MDQS0_c to MDQS1_c). In an example, the circuit 222 may be programmed (e.g., during system configuration or initialization) to select whether the data strobe I/Os of each data buffer 70a-70n are connected in parallel or not. In an example, when operating with x4 DRAMs, the data strobe I/Os may be configured using the blocks 206a, 206b, and 222 to operate independently. When operating with x8 DRAMs, the data strobe I/Os may be configured using the blocks 206a, 206b, and 222 to operate in parallel (e.g., coupled together by the circuit 220).

Figure 7:
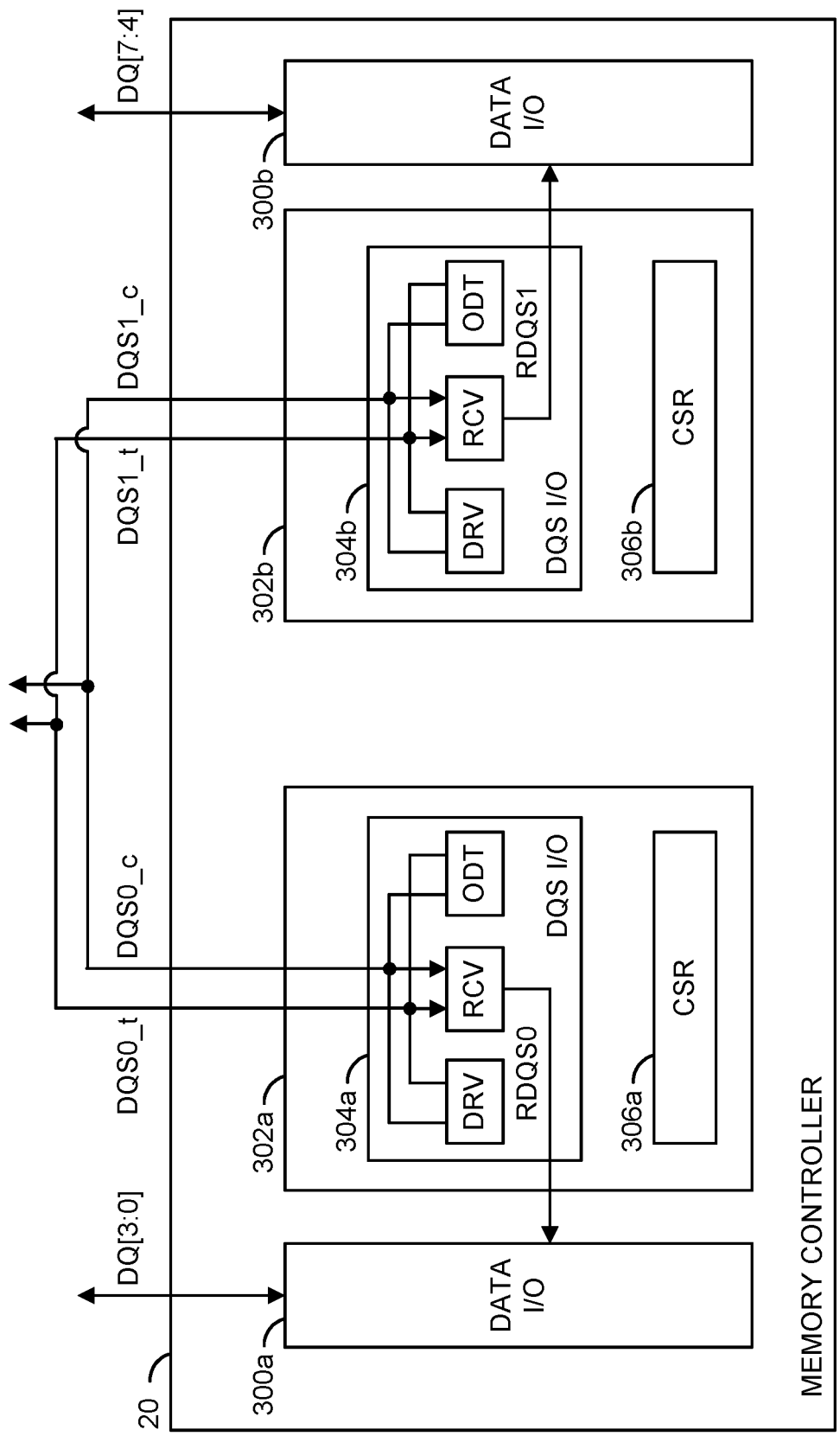
FIG. 7 is a diagram illustrating an example implementation of a memory controller in accordance with an example embodiment of the invention.

Referring to FIG. 7, a diagram is shown illustrating an example implementation of a memory controller in accordance with an example embodiment of the invention. In an example, the memory controller 20 may comprise a first data input/output block (or circuit) 300a, a second data input/output (I/O) block (or circuit) 300b, a first data strobe input/output (I/O) block (or circuit) 302a, and a second data strobe input/output (I/O) block (or circuit) 302b. In one mode, the data input/output (I/O) block 300a may be configured to present/receive the signal(s) DQ[3:0] to/from a first x4 memory device, the data input/output (I/O) block 300b may be configured to present/receive the signal(s) DQ[7:4] to/from a second x4 memory device, the data strobe input/output (I/O) block 302a may be configured to present/receive the signal(s) DQS0_t and DQS0_c to/from the first x4 memory device, and the data strobe input/output (I/O) block 302b may be configured to present/receive the signal (s) DQS1_t and DQS1_c to/from the second x4 memory device. In a second mode, the data input/output (I/O) block 300a may be configured to present/receive the signal(s) DQ[3:0] to/from a lower nibble of an x8 memory device, the data input/output (I/O) block 300b may be configured to present/receive the signal(s) DQ[7:4] to/from an upper nibble of the x8 memory device, the data strobe input/output (I/O) blocks 302a and 302b may be configured to allow the signal DQS0_t to be coupled with the signal DQS1_t and the signal DQS0_c to be coupled with the signal DQS1_c for communication with the x8 memory device. In an example, the controller 20 may be configured to operate with x8 memory devices by using traces on an associated printed circuit (mother) board to connect the signals DQS0_t and DQS1_t and the signals DQS0_c and DQS1_c.

In various embodiments, the data strobe input/output block 302a may comprise a block (or circuit) 304a and a block (or circuit) 306a. The circuit 304a may implement a data strobe I/O circuit similar to the circuit 204a described above in connection with FIG. 5. The circuit 306a may implement one or more control registers. The control registers 306a may be used to configure the circuit 304a. The circuit 306a may be configured (programmed) to control driver and termination parameters of the data strobe I/O circuit 304a. The circuit 304b may implement a data strobe I/O circuit similar to the circuit 204b described above in connection with FIG. 5. The circuit 306b may implement one or more control registers. The control registers 306b may be used to configure the circuit 304b. The circuit 306b may be configured (programmed) to control driver and termination parameters of the data strobe I/O circuit 304b. The circuits 306a and 306b generally allow the circuits 304a and 304b to be independently programmed, which allows operation of the circuit 302a and 302b with the data strobe I/Os connected in parallel for operation with x8 DRAM or operated separately for operation with x4 DRAM.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:
1. An apparatus comprising:
a control circuit comprising (i) a first differential data strobe input/output circuit having a first set of driver and termination control inputs and (ii) a second differential data strobe input/output circuit having a second set of driver and termination control inputs, wherein
said first and said second sets of driver and termination control inputs are independently programmable,
said first and said second differential data strobe input/output circuits operate in a first mode when said first differential data strobe input/output circuit is connected to a first memory device having a first data width and said second differential data strobe input/output circuit is connected to a second memory device having said first data width, and
said first and said second differential data strobe input/output circuits operate in a second mode when said first differential data strobe input/output circuit and said second differential data strobe input/output circuit are connected in parallel to a single memory device having a second data width.

2. The apparatus according to claim 1, wherein said first and said second memory devices with said first data width comprise x4 dynamic random access memories (DRAMs) and said single memory device with said second data width comprises an x8 DRAM.

3. The apparatus according to claim 1, wherein said control circuit is part of a memory controller.

4. The apparatus according to claim 1, wherein said control circuit is part of a data buffer.

5. The apparatus according to claim 1, wherein a respective input/output of said first differential data strobe input/output circuit and a respective input/output of said second differential data strobe input/output circuit are connected in parallel by printed circuit board traces when operating in said second mode.

6. The apparatus according to claim 1, wherein a respective input/output of said first differential data strobe input/output circuit and a respective input/output of said second differential data strobe input/output circuit are connected in parallel within an integrated circuit containing said control circuit when said first and said second differential data strobe input/output circuits are operating in said second mode.

7. The apparatus according to claim 1, wherein said first and said second differential data strobe input/output circuits are independently configurable using respective configuration registers.

8. The apparatus according to claim 4, wherein (i) the data buffer is one of a plurality of similarly implemented data buffers and (ii) the plurality of similarly implemented data buffers and a plurality of memory devices of either the first data width or the second data width are configured as a fourth generation double data rate (DDR4) dual in-line memory module (DIMM).

9. The apparatus according to claim 4, wherein (i) the data buffer is one of a plurality of similarly implemented data buffers and (ii) the plurality of similarly implemented data buffers and a plurality of memory devices of either the first data width or the second data width are configured as a fifth generation double data rate (DDR5) dual in-line memory module (DIMM).

10. The apparatus according to claim 6, wherein said integrated circuit further comprises a coupling circuit that is programmable to couple said respective input/outputs of said first and said second differential data strobe input/output circuits in parallel when said first and said second differential data strobe input/output circuits are operating in said second mode.

11. A method of controlling a plurality of memory devices comprising:
connecting one or more of said memory devices to a control circuit, wherein (i) said control circuit comprises a first differential data strobe input/output circuit and a second differential data strobe input/output circuit, and (ii) said first and said second differential data strobe input/output circuits each comprise driver and termination control inputs that are independently programmable;
configuring said first and said second differential data strobe input/output circuits in a first mode to operate independently when said control circuit is connected to at least two of said memory devices and said memory devices have a first data width; and
configuring said first and said second differential data strobe input/output circuits in a second mode to operate in parallel when said control circuit is connected to at least one of said memory devices and said memory devices have a second data width.

12. The method according to claim 11, further comprising:
laying out traces on a printed circuit board to connect input/output terminals of the first and the second differential data strobe input/output circuits of said control circuit in parallel to a single pair of traces connected to said at least one of the memory devices when said memory devices have said second data width.

13. The method according to claim 11, wherein said memory devices with said first data width comprise x4 DRAMs and said memory devices with said second data width comprise x8 DRAMs.

14. The method according to claim 11, wherein each of said first and said second differential data strobe input/output circuits are independently configurable using respective configuration registers.

15. The method according to claim 12, wherein said printed circuit board, said plurality of memory devices, and said control circuit are part of a double data rate (DDR) dual in-line memory module (DIMM).

16. An apparatus comprising:
a plurality of memory devices; and a plurality of data buffer circuits, each of said data buffer circuits configurable to (i) operate in a first mode when connected to memory devices having a first data width and (ii) operate in a second mode when connected to memory devices having a second data width, wherein (i) each of said data buffer circuits comprises a first differential data strobe input/output circuit and a second differential data strobe input/output circuit, (ii) said first and said second differential data strobe input/output circuits each comprise data strobe receivers, transmitters, and termination circuits that are independently programmable, (iii) said data buffers operate in said first mode when an input/output of said first differential data strobe input/output circuit is connected to a first one of said plurality of memory devices having said first data width and an input/output of said second differential data strobe input/output circuit is connected to a second one of said plurality of memory devices having said first data width, and (iv) said data buffers operate in said second mode when said input/outputs of said first and said second differential data strobe input/output circuits are connected in parallel to a single one of said plurality of memory devices having said second data width.

17. The apparatus according to claim 16, wherein said memory devices with said first data width comprise x4 DRAMs and said memory devices with said second data width comprise x8 DRAMs.

18. The apparatus according to claim 16, wherein said plurality of data buffers are configured to operate in either said first mode or said second mode to allow mixed use of both said first data width memory devices and said second data width memory devices on a memory module.

19. The apparatus according to claim 16, wherein said input/outputs of said first and said second differential data strobe input/output circuits of each of said data buffer circuits are connected in parallel by at least one of (i) printed circuit board traces, (ii) an internal connection within an integrated circuit containing said data buffer circuit, and (iii) a coupling circuit within each data buffer circuit that is programmable to couple said first and said second differential data strobe input/output circuits in parallel when said data buffer circuit is operated in said second mode.

20. The apparatus according to claim 16, wherein said first and said second differential data strobe input/output circuits of each of said data buffer circuits are independently configurable using respective configuration registers.

* * * * *